(12) United States Patent
Cheng et al.

(10) Patent No.: US 8,319,114 B2
(45) Date of Patent: Nov. 27, 2012

(54) SURFACE MOUNT POWER MODULE DUAL FOOTPRINT

(75) Inventors: Sun-Wen Cyrus Cheng, Plano, TX (US); Paulette Lemond, Rowlett, TX (US); Carl Milton Wildrick, Parker, TX (US)

(73) Assignee: Densel Lambda K.K. (JP)

( * ) Notice: Subject to any disclaimer, the term of this patent is extended or adjusted under 35 U.S.C. 154(b) by 745 days.

(21) Appl. No.: 12/061,453

(22) Filed: Apr. 2, 2008

(65) Prior Publication Data

US 2009/0251873 A1    Oct. 8, 2009

(51) Int. Cl.
*H05K 1/16* (2006.01)

(52) U.S. Cl. ........ 174/260; 174/261; 174/262; 174/267; 361/760; 361/800; 257/82; 257/99; 257/678; 257/690; 257/786

(58) Field of Classification Search .......... 174/260–262, 174/267; 361/760, 800; 257/82, 99, 678, 257/690, 786
See application file for complete search history.

(56) References Cited

U.S. PATENT DOCUMENTS

| | | | | |
|---|---|---|---|---|
| 3,790,916 A | * | 2/1974 | Keitel | 439/435 |
| 3,964,087 A | * | 6/1976 | Mallon | 338/306 |
| 4,652,977 A | * | 3/1987 | Jones | 361/793 |
| 4,843,280 A | * | 6/1989 | Lumbard et al. | 313/500 |
| 4,922,269 A | * | 5/1990 | Ikeda et al. | 347/50 |
| 4,956,694 A | * | 9/1990 | Eide | 257/686 |
| 5,055,637 A | * | 10/1991 | Hagner | 174/260 |
| 5,266,833 A | * | 11/1993 | Capps | 257/690 |
| 5,682,674 A | * | 11/1997 | Yamazaki et al. | 29/830 |
| 5,977,630 A | * | 11/1999 | Woodworth et al. | 257/712 |
| 6,011,684 A | * | 1/2000 | Devoe et al. | 361/321.1 |
| RE36,614 E | * | 3/2000 | Lumbard et al. | 313/500 |
| 6,034,438 A | * | 3/2000 | Petersen | 257/786 |
| 6,043,989 A | * | 3/2000 | Hayakawa et al. | 361/800 |
| 6,073,339 A | * | 6/2000 | Levin | 29/606 |
| 6,117,707 A | * | 9/2000 | Badehi | 438/113 |
| 6,121,678 A | * | 9/2000 | Chiu et al. | 257/700 |
| 6,262,649 B1 | | 7/2001 | Roessler et al. | |
| 6,263,565 B1 | * | 7/2001 | Gotoh et al. | 29/852 |
| 6,282,782 B1 | * | 9/2001 | Biunno et al. | 29/852 |
| 6,373,714 B1 | * | 4/2002 | Kudoh et al. | 361/760 |
| 6,566,981 B2 | * | 5/2003 | Urabe et al. | 333/193 |
| 7,180,397 B1 | | 2/2007 | Busletta et al. | |

(Continued)

OTHER PUBLICATIONS

DOSA Doc. # S05012-A, "DOSA Standard Specification Product Name: Second Generation, High Density, Non-Isolated 4.5-14V in., 12A DC/DC Converter"; Distributed-power Open Standards Alliance; May 4, 2007; 2 pp.

(Continued)

*Primary Examiner* — Xiaoliang Chen
(74) *Attorney, Agent, or Firm* — Carstens & Cahoon LLP

(57) ABSTRACT

A dual footprint mounting package for a surface mount power converter modules and its method of manufacture. Castellated regions are formed on the edge of the component package using the appropriate sized drill or milling bit. Edge plating is applied to the castellated surfaces to create edge pads. The edge plating provides electrical continuity between the edge pads and the SMT pads. Solder mask, or other materials, is applied to prevent solder from wicking between each SMT pad and its respective edge pad. Such component may be attached to a larger device PWB using either the edge pads or the SMT pads, or may even be attached using a combination of the two, such as in the event of a pad failure or other defect.

12 Claims, 8 Drawing Sheets

U.S. PATENT DOCUMENTS

| | | | |
|---|---|---|---|
| 7,304,375 B2 * | 12/2007 | Boon et al. | 257/686 |
| 7,304,417 B2 | 12/2007 | Masuko et al. | |
| 7,304,862 B2 | 12/2007 | Busletta et al. | |
| 7,456,494 B2 * | 11/2008 | Kobayakawa | 257/676 |
| 7,612,296 B2 * | 11/2009 | Rohde et al. | 174/262 |
| 7,633,159 B2 * | 12/2009 | Boon et al. | 257/730 |
| 2002/0148881 A1 * | 10/2002 | Trucco | 228/201 |
| 2003/0104713 A1 * | 6/2003 | Scott Adams et al. | 439/74 |
| 2003/0136968 A1 * | 7/2003 | Fjelstad | 257/82 |
| 2003/0213619 A1 * | 11/2003 | Denzene et al. | 174/261 |
| 2004/0041221 A1 * | 3/2004 | Boon et al. | 257/433 |
| 2005/0061854 A1 * | 3/2005 | Liu et al. | 228/180.21 |
| 2005/0167849 A1 * | 8/2005 | Sato | 257/778 |
| 2006/0044772 A1 * | 3/2006 | Miura | 361/767 |
| 2006/0055432 A1 * | 3/2006 | Shimokawa et al. | 327/5 |
| 2006/0091416 A1 * | 5/2006 | Yan | 257/99 |
| 2006/0097380 A1 * | 5/2006 | Sato | 257/706 |
| 2006/0118330 A1 * | 6/2006 | Ooyabu et al. | 174/261 |
| 2006/0231935 A1 * | 10/2006 | Nishida | 257/678 |
| 2007/0072447 A1 * | 3/2007 | Busletta et al. | 439/68 |
| 2007/0158799 A1 * | 7/2007 | Chiu et al. | 257/678 |
| 2007/0254197 A1 * | 11/2007 | Chang et al. | 429/32 |
| 2007/0257376 A1 * | 11/2007 | Shimokawa et al. | 257/778 |
| 2007/0257708 A1 * | 11/2007 | Shimokawa et al. | 327/5 |
| 2007/0296090 A1 * | 12/2007 | Hembree | 257/784 |
| 2008/0001240 A1 * | 1/2008 | Minamio et al. | 257/434 |
| 2008/0055859 A1 * | 3/2008 | Furukawa et al. | 361/704 |
| 2008/0202804 A1 * | 8/2008 | Fakutomi et al. | 174/267 |
| 2010/0039044 A1 * | 2/2010 | Hatakenaka et al. | 315/291 |

OTHER PUBLICATIONS

DOSA Doc. # S05006-A, "DOSA Standard Specification Product Name: Non-lsolated, Next Generation, High Density 4.5-14V in., 3/6A DC/DC Converter"; Distributed-power Open Standards Alliance; Apr. 20, 2007; 2 pp.

* cited by examiner

*TOP VIEW*

*SIDE VIEW*

*BOTTOM VIEW*

*TOP VIEW*

*SIDE VIEW*

*BOTTOM VIEW*

SURFACE MOUNT POWER MODULE DUAL FOOTPRINT

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC

Not Applicable

BACKGROUND OF THE INVENTION

1. Field of the Invention

The present invention relates to surface mount electrical component packaging technology, and, more specifically, to a surface mount power module dual footprint device and its method of manufacture.

2. Description of Related Art Including Information Disclosed Under 37 CFR 1.97 and 1.98

Electronic device manufacturers face tremendous pressure to make devices small, yet inexpensive. With the advent of surface mount packaging technology this goal has been realized. Surface mount technology (SMT) has evolved to allow Printed wiring assemblies (PWA) to be very high density configurations. By utilizing standard SMT devices and printed circuit boards (PCB) or printed wiring boards (PWB), electrical designs can be made more efficient and costs can be reduced.

Some electrical designs require the use of power converter modules. These power converter modules are discrete components which are assembled to PWA. The majority of power converter modules utilize through-hole mounting technology to form the connection to the PCB. Using a power converter module that utilizes through-hole connections to a PWB having a majority of SMT components increases the number of manufacturing steps required for the PWA. This increase in the number of manufacturing steps increases the overall cost of the final PWA.

To reduce the manufacturing steps associated with through-hole mounted power converter modules on a PWA with a majority of SMT components, surface mount peripheral leaded power converter modules, such as gull-wing and J-lead, were introduced. With this evolution, the size of the power converter modules occupied more space on the PWB. To address this problem, the leads were moved beneath the power converter module. Specialized manufacturing techniques, tools, and equipment are required to successfully utilize this package design in the PWA manufacturing process. The use of connections beneath the power converter module increases the difficulty of inspecting the connections and reworking this device, if necessary. Stand-off components may be added to the power converter module to assist with visual inspection. However, stand-off or spacer components add to the overall height of the device and may create further interference with other components. Furthermore, the added stand-off components increase the overall material and manufacturing cost of the power converter modules.

Specialized sockets for accepting the power supply package were also developed to allow easy placement and removal of a power converter module with bottom leads. These specialized sockets may be more easily mounted and soldered to the PWB. Once properly mounted, the power converter module may simply be plugged into the socket. However, this extra component again adds to the overall power supply height and increases the costs associated with design and manufacture of the PWA.

FIG. 1 and FIG. 2 each depict a power converter module mounting standard as proposed by the Distributed-Power Open Standards Alliance (DOSA). Instead of using the peripheral leaded design, the solder joints are located beneath the component. As previously mentioned, this placement of the solder joint connections beneath the device increases the manufacturing, inspection and repair process costs. Pins or stand-offs may be utilized to raise the power converter module to assist with visual inspection, but again this adds to the overall height and cost of the power converter module.

A properly formed solder joint is necessary for reliable electrical and mechanical connection of the power converter module to the PCB. The solder joints of the SMT power converter module are formed during the solder reflow manufacturing process. During the solder reflow process, the solder alloy must reach its melting point temperature to create the connection between the pads on the power converter module and the pads of the PCB. In order to reach the necessary solder melting point temperature beneath the power converter module, devices of lower thermal mass located on the PCB may become overheated.

The solder joints, of the power converter module, located beneath the device should be inspected to qualify their mechanical and electrical integrity. In the event that the power converter module must be removed from the PWA, specialized process, tools, and equipment may be required to melt the solder joints beneath the device. During the removal process, failure analysis evidence may be destroyed.

Second sourcing electronics devices is a typical purchasing practice in the electronics industry. A PWA manufacturer may desire a second source for power module converters in order to stimulate competitive pricing, alleviate component shortages, and lessen the risk of relying on one supplier. To accommodate the second source strategy, a PCB design may be modified to accommodate the use of two different mounting designs, such as through-hole and surface mount.

Accordingly, an alternative solder joint connection design for power converter modules is needed to facilitate ease of PWA manufacture, inspection and rework, and to reduce material cost. The present invention satisfies these needs and others as shown in the following detailed description and accompanying drawings.

BRIEF SUMMARY OF THE INVENTION

The present invention provides a dual footprint mounting package for surface mount power converter modules and a method of its construction. While two footprints are provided for illustration of the invention, they are not intended to limit the invention to the specific embodiments. One of the provided footprints is fully compatible with the industry standard for 2nd generation POL modules, while the other footprint illustrates that any non-standard SMT layout is acceptable.

In the first embodiment, the isolated module solder pads are left in place. During manufacture of the device, the copper etch for each pad is extended to the edge of the PWB. The bottom pads are then separated from the edge plating with the solder mask. In this manner, each component package has the standard SMT pads available in addition to the edge pads. Each component may be attached to a PWB using the edge pads or the SMT pads.

In a second embodiment, a non-standard SMT footprint is provided. Certain of the SMT pads feature electrically-equivalent plated edge pads with a solder barrier between the two. Other SMT pads may not have a corresponding plated edge pad, while some plated edge pads may be isolated and not have a corresponding SMT pad to which it is connected. Isolated edge pads may be utilized to increase the mechanical integrity of the overall component and PWA as well as provide stability during manufacturing.

The edge pads are created by forming a castellation feature in the edge of the PWB. This castellation feature is formed using a drill or special purpose milling bit, and may extend any distance over the PWB edge. Once formed, the castellation feature is plated, forming the edge pad. If the edge pad is to be in electrical continuity with an SMT pad, a trace is etched into the substrate conductive material and a solder barrier is formed to prevent flow of solder between the SMT pad and the edge pad.

These and other improvements will become apparent when the following detailed disclosure is read in light of the supplied drawings. This summary is not intended to limit the scope of the invention to any particular described embodiment or feature. It is merely intended to briefly describe some of the key features to allow a reader to quickly ascertain the subject matter of this disclosure. The scope of the invention is defined solely by the claims when read in light of the detailed disclosure.

BRIEF DESCRIPTION OF THE SEVERAL VIEWS OF THE DRAWING(S)

The present invention will be more fully understood by reference to the following detailed description of the preferred embodiments of the present invention when read in conjunction with the accompanying drawings, wherein.

Figure 1:
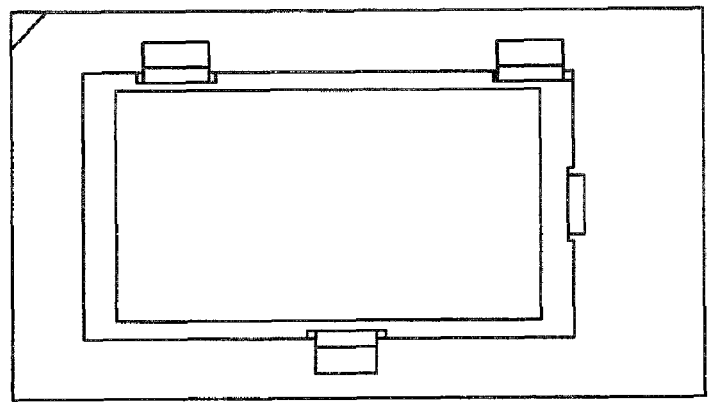
FIG. 1 is a schematic of the prior art DOSA Second Generation, High Density, Non-Isolated 4.5-14Vin, 12 A DC/DC Converter mounting standard specification.
Figure 1:
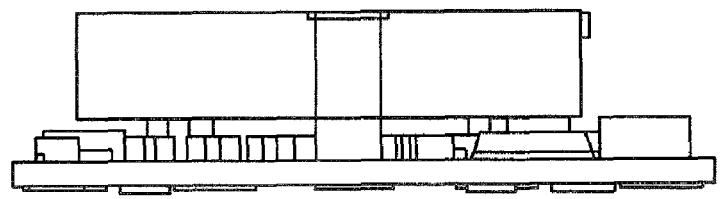
Figure 1:
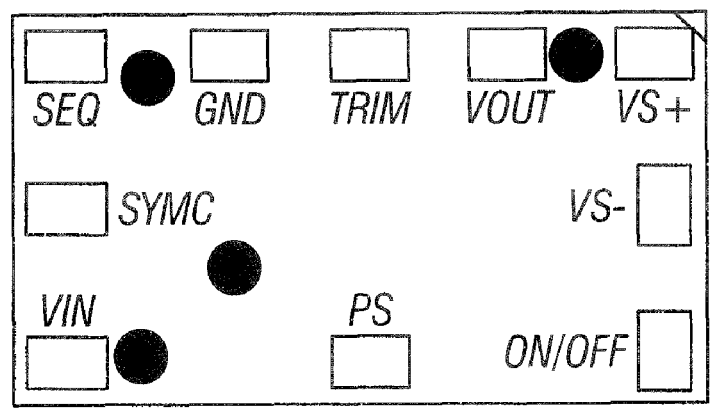

The above figures are provided for the purpose of illustration and description only, and are not intended to define the limits of the disclosed invention. Use of the same reference number in multiple figures is intended to designate the same or similar parts. Furthermore, when the terms "top," "bottom," "first," "second," "upper," "lower," "height," "width," "length," "end," "side," "horizontal," "vertical," and similar terms are used herein, it should be understood that these terms have reference only to the structure shown in the drawing and are utilized only to facilitate describing the particular embodiment. The extension of the figures with respect to number, position, relationship, and dimensions of the parts to form the preferred embodiment will be explained or will be within the skill of the art after the following teachings of the present invention have been read and understood. (58,266).

DETAILED DESCRIPTION OF THE INVENTION

The present invention provides a dual, or alternate, footprint mounting package for surface mount power converter s modules and a method of its construction. While surface mount power converter modules are discussed in detail, one skilled in the art will appreciate that the novel method for providing a dual or alternate footprint packaging is equally applicable to other types of surface mount components. Further, while PWBs having copper material are discussed, other conductive materials such as aluminum may be utilized and are within the scope of the present invention.

In the present invention, the term "trace" refers to the conductive material remaining on the PWB or PCB following the etching process.

Figure 2:
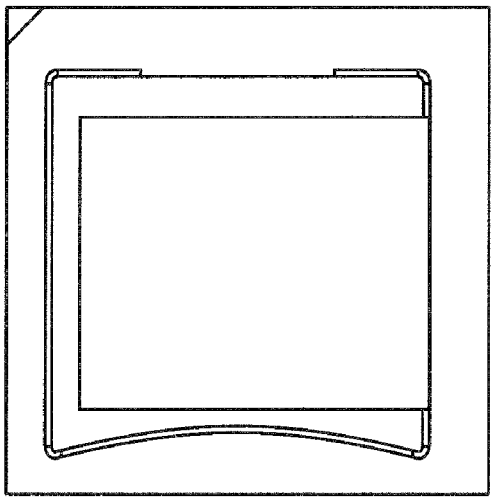
FIG. 2 is a schematic of the prior art DOSA Non-Isolated, Next Generation, High Density 4.5-14Vin, 3/6 A DC/DC Converter mounting standard specification.
Figure 2:
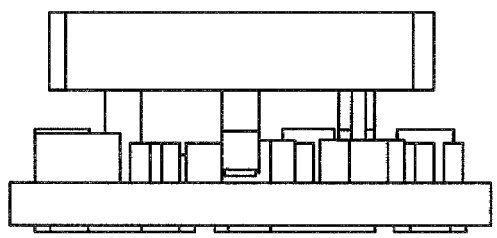
Figure 2:
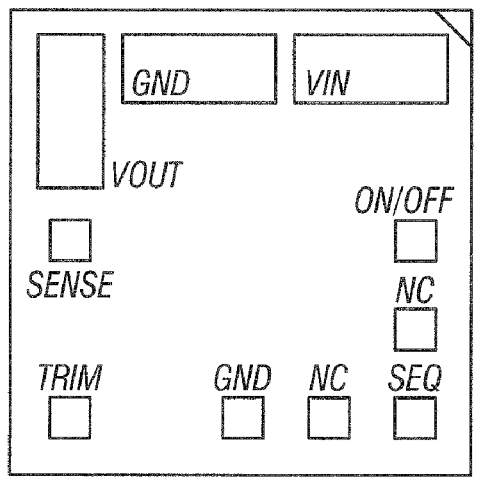
Figure 3A:
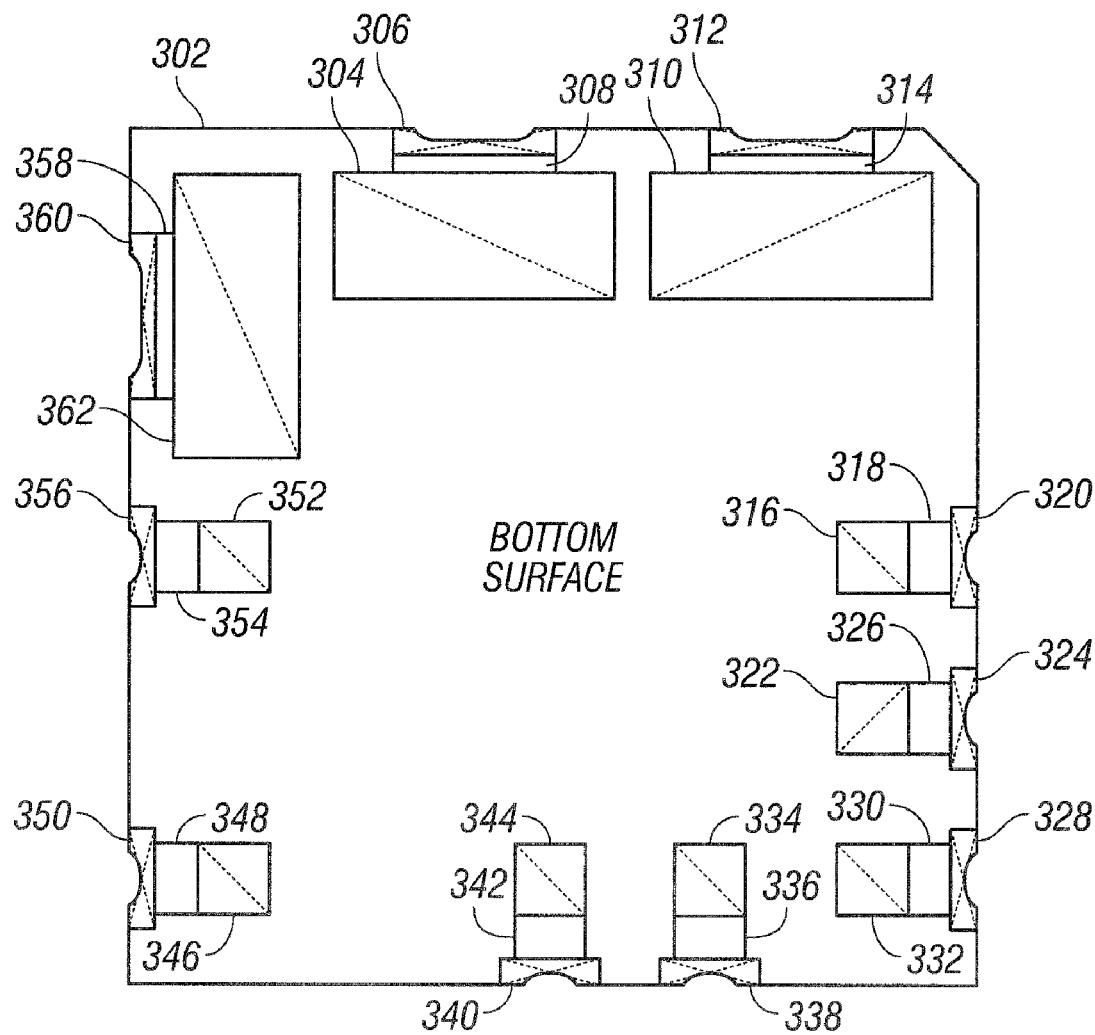
FIG. 3A is a bottom view of a first embodiment of the present invention, providing a dual mounting footprint.

FIG. 3A provides a view of the bottom surface of a first embodiment of the present invention. This embodiment provides the DOSA standard mount points of FIG. 2 in addition to the novel edge mounting points. The standard pin 1 "ON/OFF" function SMT pad (316) has an electrically equivalent edge pad (320) separated by solder mask (318). The standard pin 2 "VIN" function SMT pad (310) has an electrically equivalent edge pad (312) separated by solder mask (314). The standard pin 3 "GND" function SMT pad (304) has an electrically equivalent edge pad (306) separated by solder mask (308). The standard pin 4 "VOUT" function SMT pad (362) has an electrically equivalent edge pad (360) separated by solder mask (358). The standard pin 5 "SENSE" function SMT pad (352) has an electrically equivalent edge pad (356) separated by solder mask (354). The standard pin 6 "TRIM" function SMT pad (346) has an electrically equivalent edge pad (350) separated by solder mask (348). The standard pin 7 "GND" function SMT pad (344) has an electrically equivalent edge pad (340) separated by solder mask (342). The standard pin 8 "NC" function SMT pad (334) has an electrically equivalent edge pad (338) separated by solder mask (336). The standard pin 9 "SEQ" function SMT pad (332) has an electrically equivalent edge pad (328) separated by solder mask (330). And, the standard pin 10 "PGOOD" or "NC" function SMT pad (322) has an electrically equivalent edge pad (324) separated by solder mask (326).

Figure 3B:
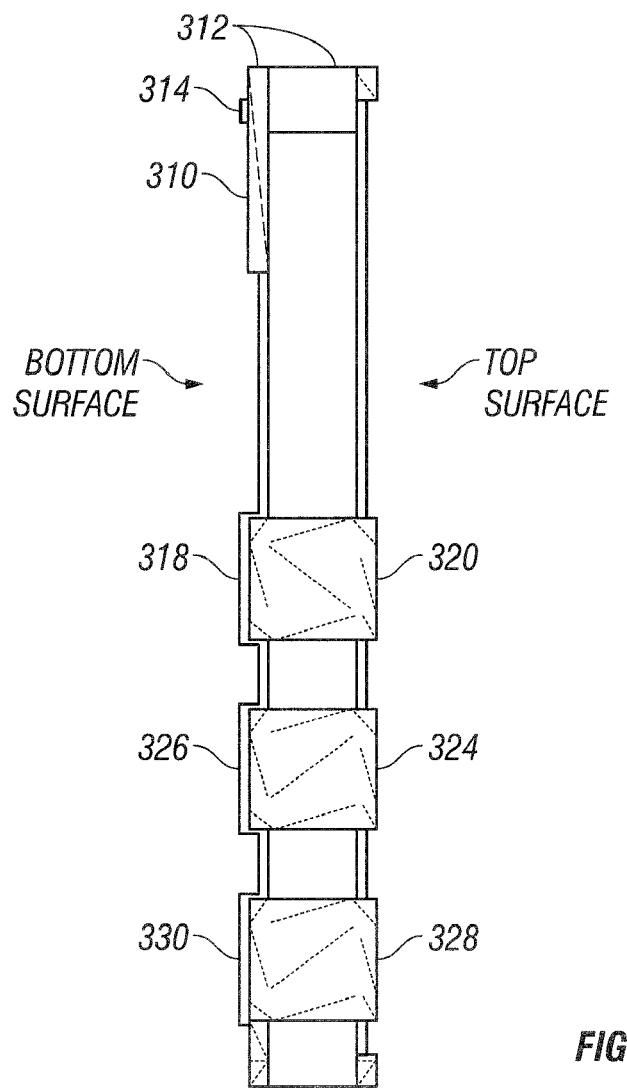
FIG. 3B is a side view of the first embodiment of the present invention, highlighting certain portions of the edge plated castellation features, (i.e., edge pads)

FIG. 3B provides a view of the edge of the first embodiment. Visible in this view are the edge pads for pin 1 (320), pin 9 (328), and pin 10 (324) along with their respective solder masks (318, 330, and 326). The plating for these edge pads is applied across the entire edge as depicted. The remaining edge pads (those not shown) are plated in a similar fashion. The edge pad for pin 2 (312) is also visible in addition to its SMT pad (310) and solder mask (314).

Figure 3C:
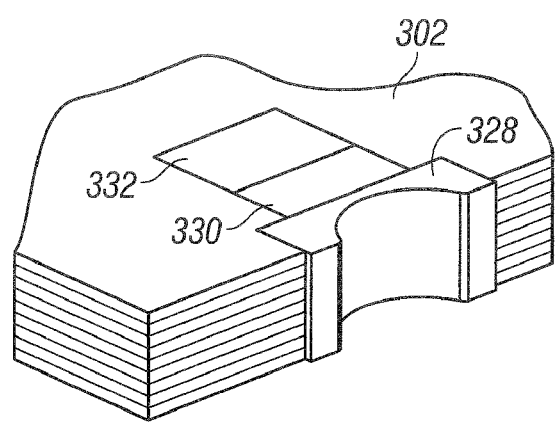
FIG. 3C is a close-up isometric view of the lower right edge pad of FIG. 3A.

FIG. 3C further depicts an isometric view of the edge pad plating of pin 9 (332). This view provides a close-up image of the castellation feature utilized to create the edge pad (328). The solder mask (330) is visible as it provides a barrier function to prevent solder from flowing between the SMT pad (332) and the edge pad (328).

Figure 3D:
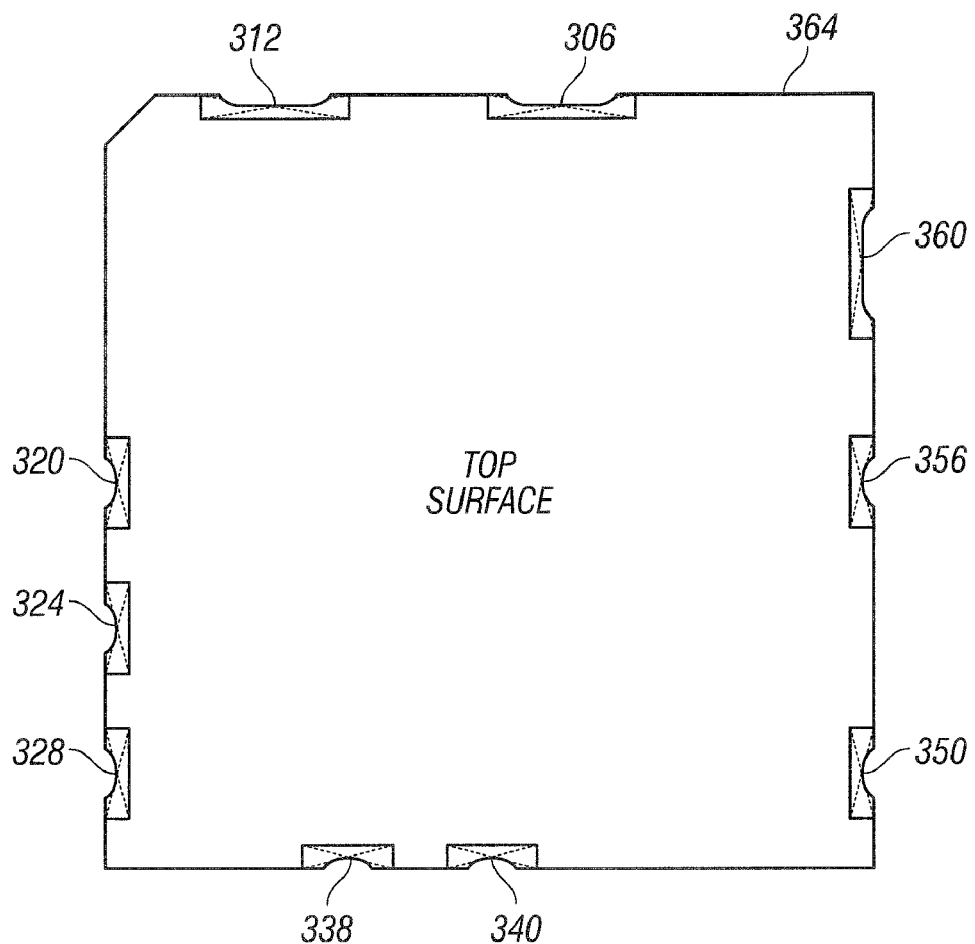
FIG. 3D is a top view of the first embodiment.

FIG. 3D depicts a top surface view of the first embodiment. In this view, it is shown that a portion of each edge pad is accessible from the top surface (364) of the packaging as well. Providing edge plating in each castellation feature that extends to the top surface allows the pins to be more easily probed or inspected. Further, the increased amount of pin area allows for greater surface area on each pin to electrically contact with various sockets designed to accept such footprints. The increased edge contact area also affords better connections with test probes designed to facilitate in-circuit testing and signal injection. However, in another embodiment the edge plating may only cover a portion of the height of the castellation feature in order to prevent the plated region from extending above the top surface. This can be helpful to prevent shorting of the edge pads due to the addition of a chip carrier or a thermal device such as a heatsink.

Figure 4A:
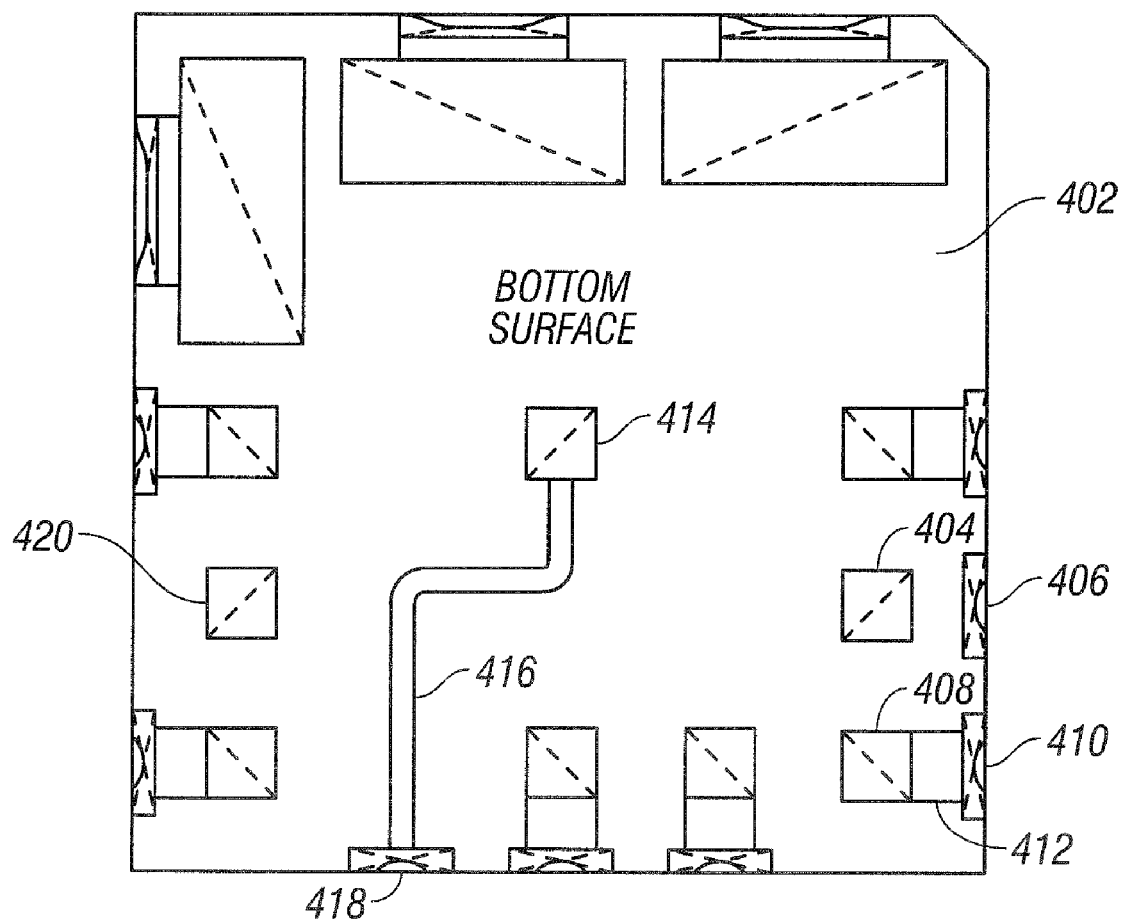
FIG. 4A is a bottom view of a second embodiment of the present invention, providing an alternate dual mounting footprint.

FIG. 4 depicts an alternate embodiment of the present invention. In FIG. 4A, a bottom view of a component having an alternate SMT placement (i.e., non-industry standard) is shown. The bottom surface (402) may support any SMT pad arrangement. For example, the figure depicts a center SMT pad (414) in electrical continuity with an plated edge pad (418) via an extended trace (416) etched in the bottom surface (402).

FIG. 4A also shows that not all edge pads need to be in electrical continuity with an SMT pad. For example, an edge pad (406) is depicted near an SMT pad (404) with no conductive trace between the two. This isolated edge pad (406) may be utilized to provide additional stability for the component by providing an additional attachment point to the device board to which it is attached. Moreover, use of an additional edge pad to secure the component in place may aid in manufacture by holding the component steady during solder reflow operations.

In yet another embodiment, the isolated edge pad (406) can serve as an isolated electrical test point for the component. The isolated edge pad may be connected to internal circuitry by conductive traces within inner layers of the multi-layer PWB, This type of isolated edge pad can serve to anchor the component to the PWB to assist in placement and support and provide additional test-point connectivity.

This embodiment also allows for the existence of isolated edge pads (406) in conjunction with edge pads (410) in electrical continuity with an SMT pad (408), and having a solder barrier (412) as mentioned above. Further, SMT pads (420) having no corresponding edge pad may also be included in the overall footprint.

Figure 4B:
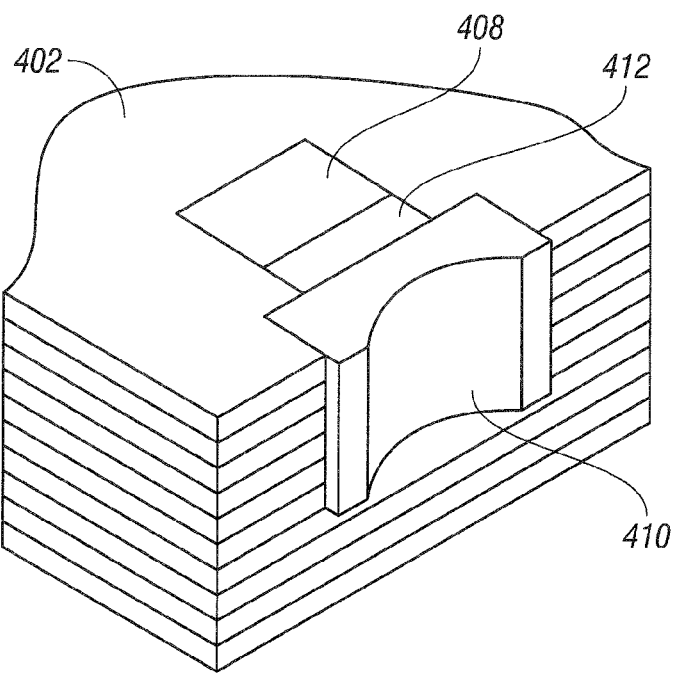
FIG. 4B is a close-up isometric view of an edge plated castellation feature on the second embodiment that covers only a portion of the height of the multi-layer PWB edge.

FIG. 4B further depicts an isometric view of a partial-height edge pad (410) plating of the second embodiment. Clearly shown are the corresponding SMT pad (408) and the solder barrier (412). In another embodiment, this partial-height edge pad may be electrically isolated from an SMT pad as previously described, and may be utilized for additional structural support or manufacturing ease. This partial-height edge pad may be used with any standard or non-standard SMT pad placement.

Figure 4C:
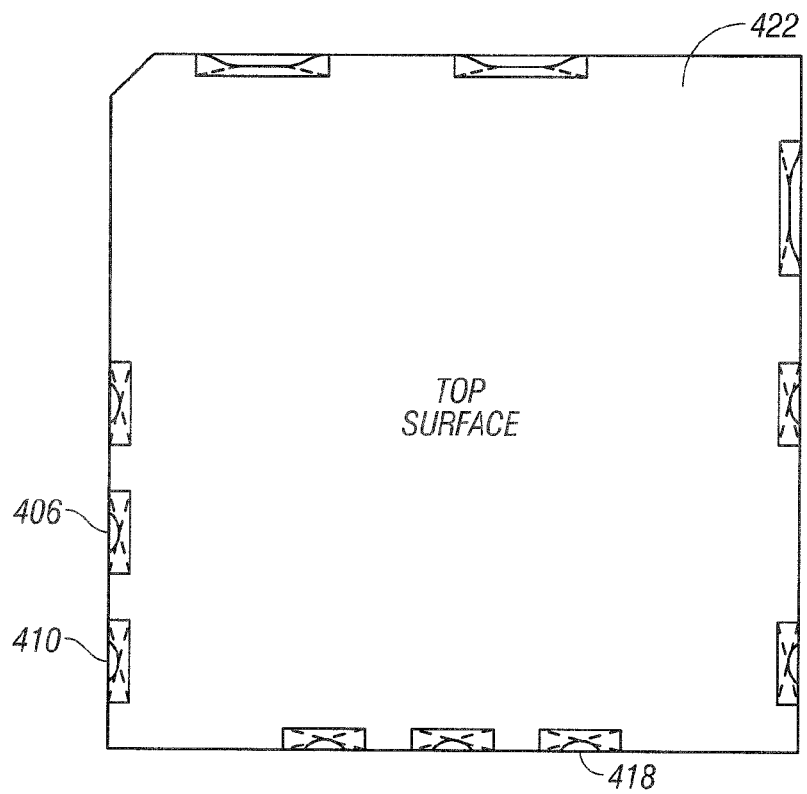
FIG. 4C is a top view of the second embodiment.

FIG. 4C depicts a top surface view of the second embodiment. In this view the edge plated pads are visible, including the isolated edge pad (406), the edge pad (410) in electrical continuity with an SMT pad, and the extended trace edge pad (418). These edge pads may extend the full height of the component such that they protrude above the top surface (422), or they may be partial-height edge pads that do not protrude.

Figure 5:
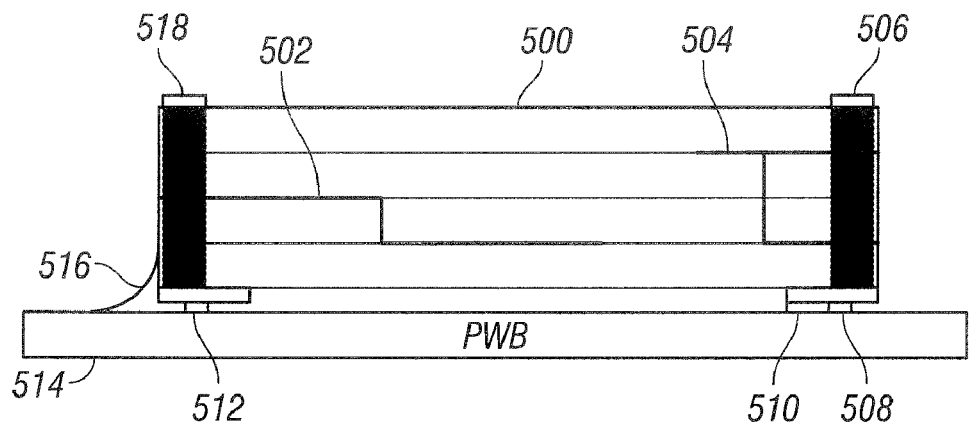
FIG. 5 is a cutaway image of an embodiment of the present invention to highlight its multi-layer PWB construction and methods of attachment to a larger device PCB.

FIG. 5 depicts a cross-section of an embodiment of the present invention as it is constructed utilizing a four layer PWB (500). As shown in the cross-section, only certain layers may require circuit traces connecting to a particular edge pad. For example, the left edge pad (518) features electrical continuity with a trace (502) on the second layer from the bottom. As depicted, this trace (502) provides continuity from the edge pad (518) plating through a via to the top surface of the first layer. Likewise, the right edge pad (506) is depicted with trace connections to the top surface of the first layer and the top surface of the third layer (504). The actual layer connections will depend on the routing requirements of the overall component PWB (500). Further, although a four layer PWB is discussed, any number of layers may be utilized and is within the scope of the present invention.

Also depicted in FIG. 5 are two methods for soldering a package featuring the inventive dual footprint concept to a device PWB (514). As shown, the left edge pad (518) is soldered to the PWB (514) with the solder fillet (516) bridging the edge to the PWB pad. The solder mask (512) acts as a solder barrier device that prevents the solder (516) from flowing to the SMT pad beneath the package. This allows for easy visual inspection of the solder joint and also allows for simplified reworking of the solder joint. While the use of solder mask as a solder barrier is discussed, other materials may also serve as a solder barrier. For example, any polymer substance suitable for coating PWBs may serve as a solder barrier. Such examples include, but are not limited to, conformal coating materials such as acrylics, epoxies, urethanes, parxylenes or silicones.

The SMT pads beneath the package (502) may be utilized. During manufacture a fixed amount of solder will be placed on the PCB SMT pad. Once the component is placed on the board and the soldering process begun, the solder will melt and form a fillet (510) connecting the component SMT pad to the device PWB SMT pad. To prevent wicking of the solder up the right edge pad (506), a solder mask (508) is provided as a solder barrier device. Because it is difficult to inspect joints beneath an SMT component, it is important that the amount of solder available to make the joint be closely controlled to ensure adequate joint strength. If solder were allowed to wick out from the joint in an uncontrolled fashion, the joint would likely be too weak to function properly. The solder barrier device helps control the flow of the molten solder.

Rework of an SMT component often requires use of specialized tools to melt the obstructed solder joints. Use of special hot air nozzles to direct the heat beneath the component often damages the SMT pads on the device PWB. If the PWB were designed such that it could accommodate use of either the SMT pads or the edge pads, then a new component could be installed over damaged device SMT pads with the solder joint formed on the edge pad instead. This would allow use of an otherwise unusable PWB.

Figures 6, 7:
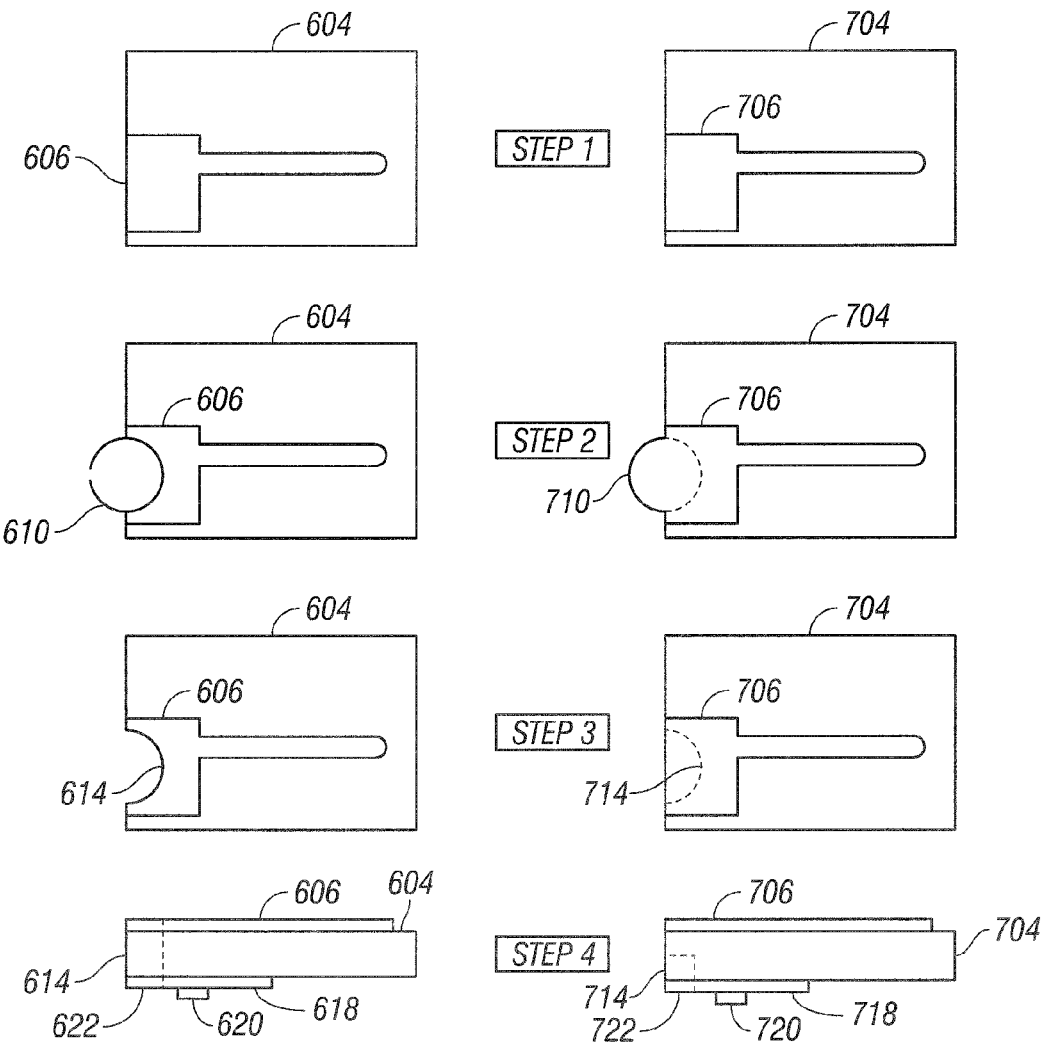
FIG. 6 is a diagram showing the basic steps utilized to create an edge connection that covers the full height of a multi-layer PWB edge.
FIG. 7 is a diagram showing the basic steps utilized to create an edge connection that covers only a portion of the height of a multi-layer PWB edge.

FIG. 6 depicts the steps involved in creating a component PWB with the dual footprint inventive concept. In Step 1, the component PWB substrate (604) copper is etched to form any necessary edge connection (606). Any number of layers of substrate may be utilized. Once the layers of substrate (604) are etched, the layers are stacked. In Step 2, either a drill bit or special purpose milling bit (610) is utilized to form the castellation in the edge of the PWB at the area of the edge copper (606). In Step 3 the castellation is formed and the unnecessary material is removed (614). The PWB is then edge plated in the castellation feature (614) to form the edge pad. In Step 4, solder mask (620) is applied to separate the SMT pad (618) from the edge pad (622). This solder mask allows for electrical continuity between the SMT pad (618) and the edge pad (622) while preventing wicking of solder between the two.

FIG. 7 depicts the steps involved in creating a component PWB edge connector that spans only a portion of the height of the PWB edge. In Step 1 as before, the component PWB substrate (704) copper is etched to form any necessary edge connection (706). Any number of layers of substrate may be utilized. Once the layers of substrate (604) are etched, the layers are stacked. In Step 2, either a drill bit or special purpose milling bit (610) is utilized to form the castellation in the edge of the PWB at the area of the edge copper (606). In Step 3 the castellation is formed and the unnecessary material is removed (614). In this embodiment the castellation feature spans only a portion of the PWB edge height. The PWB is then edge plated in the castellation feature (614) to form the edge pad. In Step 4, solder mask (620) is applied to separate the SMT pad (618) from the edge pad (622). This solder mask allows for electrical continuity between the SMT pad (618) and the edge pad (622) while preventing wicking of solder between the two.

While the DOSA SMT specification of FIG. 2 was depicted in the figures and discussed in detailed embodiments, one skilled in the art will appreciate that the inventive concept may be applied equally to the DOSA SMT specification of FIG. 1. Further, other standard or non-standard SMT pad designs may be utilized without exceeding the scope of the present invention.

The invention may be embodied in other specific forms without departing from the spirit or essential characteristics thereof. The present embodiments are therefore to be considered in all respects as illustrative and not restrictive. Accordingly, the scope of the invention is established by the appended claims rather than by the foregoing description. All changes which come within the meaning and range of equivalency of the claims are therefore intended to be embraced therein. Further, the recitation of method steps does not necessarily denote a particular sequence for execution of the steps. Such method steps may therefore be performed in a sequence other than that recited unless the particular claim expressly states otherwise. (58,266).

We claim:

1. A dual footprint mounting package for a surface mount technology (SMT) electrical component, the package comprising:
   in a SMT power converter module device, at least one edge pad in electrical continuity with a SMT pad, wherein the SMT pad forms an electrical connection to the SMT power converter module device when soldered to a corresponding pad on a PWB, and the edge pad provides an alternate point for forming an electrical connection between the SMT power converter module device and the PWB when soldered to a surface pad on the PWB; and
   at least one isolated edge pad not in electrical continuity with the SMT pad, wherein the isolated edge pad forms a mechanical connection to the PWB when soldered to a pad on the PWB.

2. The package of claim 1 wherein at least one of the edge pads comprises plating that extends to approximately the height of the edge of the package.

3. The package of claim 1 wherein at least one of the edge pads comprises plating that extends a distance that is less than the height of the edge of the package, such that the plating is below the top surface of the package.

4. A dual footprint mounting package for a surface mount technology (SMT) electrical component, the package comprising:
   in a SMT power converter module device, at least one edge pad in electrical continuity with a SMT pad, wherein the SMT pad forms an electrical connection to the SMT power converter module device when soldered to a corresponding pad on a PWB, and the edge pad provides an alternate point for forming an electrical connection between the SMT power converter module device and the PWB when soldered to a surface pad on the PWB; and
   a solder barrier device to prevent the flow of solder between the edge pad and its respective SMT pad.

5. The package of claim 4 wherein at least one of the edge pads comprises plating that extends to approximately the height of the edge of the package.

6. The package of claim 4 wherein at least one of the edge pads comprises plating that extends a distance that is less than the height of the edge of the package, such that the plating is below the top surface of the package.

7. A dual footprint mounting package for a surface mount technology (SMT) electrical component, the component utilizing at least one SMT pad, the package comprising:
   at least one edge pad in electrical continuity with the SMT pad, wherein the SMT pad forms an electrical connection to the SMT electrical component when soldered to a corresponding pad on a PWB, and the edge pad provides an alternate point for forming an electrical connection between the SMT electrical component and the PWB when soldered to a surface pad on the PWB; and
   at least one isolated edge pad not in electrical continuity with the SMT pad, wherein the isolated edge pad forms a mechanical connection to the PWB when soldered to a pad on the PWB.

8. The package of claim 7 wherein at least one of the edge pads comprises plating that extends to approximately the height of the edge of the package.

9. The package of claim 7 wherein at least one of the edge pads comprises plating that extends a distance that is less than the height of the edge of the package, such that the plating is below the top surface of the package.

10. A dual footprint mounting package for a surface mount technology (SMT) electrical component, the component utilizing at least one SMT pad, the package comprising:
    at least one edge pad in electrical continuity with the SMT pad, wherein the SMT pad forms an electrical connection to the SMT electrical component when soldered to a corresponding pad on a PWB, and the edge pad provides an alternate point for forming an electrical connection between the SMT electrical component and the PWB when soldered to a surface pad on the PWB; and
    a solder barrier device to prevent the flow of solder between the edge pad and its respective SMT pad.

11. The package of claim 10 wherein at least one of the edge pads comprises plating that extends to approximately the height of the edge of the package.

12. The package of claim 10 wherein at least one of the edge pads comprises plating that extends a distance that is less than the height of the edge of the package, such that the plating is below the top surface of the package.

* * * * *

UNITED STATES PATENT AND TRADEMARK OFFICE
CERTIFICATE OF CORRECTION

| | |
|---|---|
| PATENT NO. | : 8,319,114 B2 |
| APPLICATION NO. | : 12/061453 |
| DATED | : November 27, 2012 |
| INVENTOR(S) | : Sun-Wen Cyrus Cheng et al. |

Page 1 of 1

It is certified that error appears in the above-identified patent and that said Letters Patent is hereby corrected as shown below:

Title Page,
Item (73), Assignee: delete "Densel" and insert --Densei--.

Signed and Sealed this
Thirtieth Day of April, 2013

Teresa Stanek Rea
*Acting Director of the United States Patent and Trademark Office*